(12) United States Patent
Dai et al.

(10) Patent No.: US 11,499,080 B2
(45) Date of Patent: Nov. 15, 2022

(54) THERMAL INTERFACE MATERIAL, AND PREPARATION AND APPLICATION THEREOF

(71) Applicant: Ningbo Institute of Materials Technology & Engineering, Chinese Academy of Sciences, Zhejiang (CN)

(72) Inventors: Wen Dai, Zhejiang (CN); Zhengde Lin, Zhejiang (CN); Nan Jiang, Zhejiang (CN); Jinhong Yu, Zhejiang (CN); Dan Dai, Zhejiang (CN); Hao Hou, Zhejiang (CN)

(73) Assignee: NINGBO INSTITUTE OF MATERIALS TECHNOLOGY & ENGINEERING CHINESE ACADEMY OF SCIENCES, Zhejiang (CN)

( * ) Notice: Subject to any disclaimer, the term of this patent is extended or adjusted under 35 U.S.C. 154(b) by 433 days.

(21) Appl. No.: 16/612,230

(22) PCT Filed: May 8, 2018

(86) PCT No.: PCT/CN2018/086005
§ 371 (c)(1),
(2) Date: Nov. 8, 2019

(87) PCT Pub. No.: WO2018/205924
PCT Pub. Date: Nov. 15, 2018

(65) Prior Publication Data
US 2021/0054253 A1    Feb. 25, 2021

(30) Foreign Application Priority Data

May 10, 2017 (CN) .......................... 201710324801.7

(51) Int. Cl.
| | | |
|---|---|---|
| *C09K 5/14* | (2006.01) | |
| *C01B 32/194* | (2017.01) | |
| *C01B 21/064* | (2006.01) | |
| *C08K 9/02* | (2006.01) | |
| *C08L 79/08* | (2006.01) | |
| *H01L 23/373* | (2006.01) | |
| *B82Y 30/00* | (2011.01) | |

(52) U.S. Cl.
CPC ............ *C09K 5/14* (2013.01); *C01B 21/0648* (2013.01); *C01B 32/194* (2017.08); *C08K 9/02* (2013.01); *C08L 79/08* (2013.01); *H01L 23/3735* (2013.01); *H01L 23/3737* (2013.01); *B82Y 30/00* (2013.01); *C01B 2204/02* (2013.01); *C01B 2204/24* (2013.01); *C08K 2201/001* (2013.01); *C08K 2201/011* (2013.01)

(58) Field of Classification Search
CPC ... C09K 5/14; H01L 23/3735; H01L 23/3737; B82Y 30/00; C01B 21/0648; C01B 32/194; C08L 79/08; C08K 9/02

USPC ...................................................... 428/411.1
See application file for complete search history.

(56) References Cited

U.S. PATENT DOCUMENTS

| | | | |
|---|---|---|---|
| 2010/0128439 A1 | 5/2010 | Tilak et al. | |
| 2014/0328024 A1* | 11/2014 | Mataya .............. | H05K 7/20454 361/720 |

FOREIGN PATENT DOCUMENTS

| | | |
|---|---|---|
| CN | 1681381 | 10/2005 |
| CN | 1841713 | 10/2006 |
| CN | 105001450 | 10/2015 |
| CN | 105324843 | 2/2016 |
| CN | 105417535 A | 3/2016 |
| CN | 105752963 A | 7/2016 |
| CN | 106947436 | 7/2017 |
| CN | 107815114 A | 3/2018 |
| WO | 9822770 A1 | 5/1998 |
| WO | 2016048335 A1 | 3/2016 |

OTHER PUBLICATIONS

Achour et al . . . , "thermal Properties of Carbon Nanowall Layers Measured by a Pulsed Photothermal Technique" Applied Physics Letters, 102, 5 pages, 2013.

Lian et al., "Vertically Aligned and Interconnected Graphene Networks for High Thermal Conductivity of Epoxy Composites with Ultralow Loading", Chemistry of Materials, 28, pp. 6096-6104, 2016.

Jung et al., "High Through-Plane Thermal Conduction of Graphene Nanoflake Filled Polymer Composites Melt-Processed in a L-Shape Kinked Tube" Applied Materials and Interfaces, 7, pp. 15256-15262, 2015.

(Continued)

*Primary Examiner* — Hui H Chin
(74) *Attorney, Agent, or Firm* — Panitch Schwarze Belisario & Nadel LLP

(57) ABSTRACT

This application describes a thermal interface material, and preparation and application thereof. Specifically, a thermal interface material is described. The thermal interface material is obtained by bending and folding, optional horizontal pressing and optional high-temperature treatment of a laminated structure. Two-dimensional high-thermal-conductivity nano-plates on the upper surface and the lower surface of the thermal interface material have a horizontal stack structure. Two-dimensional high-thermal-conductivity nano-sheets located between the upper surface and the lower surface of the thermal interface material have both a vertical stack structure and a curved stack structure. Also described are a preparation method and application of the thermal interface material. The thermal interface material combines excellent thermal conductivity and compressibility; the preparation method has the characteristics of simple process, low costs, safety and environmental protection, and accordingly, the thermal interface material can effectively resolve the heat dissipation problem of electronic products.

10 Claims, 4 Drawing Sheets

(56) References Cited

OTHER PUBLICATIONS

Zhang et al., "High-performance Thermal Interface materials consisting of Vertically Aligned Graphene Film and Polymer", Carbon, 109, pp. 552-557, 2016.
Office Action dated Jul. 24, 2020 in EP Application No. 18797992.7.
Office Action dated Sep. 17, 2021 in CN Application No. 201710324801.7.
Wang et al., "Wrinkled, wavelength-tunable graphene-based surface topographies for directing cell alignment and morphology," Carbon, vol. 97, pp. 14-24 (2016).
Zang et al., "Stretchable and High-Performance Supercapacitors with Crumpled Graphene Papers," Scientific Reports, vol. 4, No. 6492, pp. 1-7 (2014).

\* cited by examiner

THERMAL INTERFACE MATERIAL, AND PREPARATION AND APPLICATION THEREOF

CROSS-REFERENCE TO RELATED APPLICATION

This application is a Section 371 of International Application No. PCT/CN2018/086005, filed May 8, 2018, which was published in the Chinese language on Nov. 15, 2018, under International Publication No. WO 2018/205924 A1, which claims priority under 35 U.S.C. § 119(b) to Chinese Patent Application No. 201710324801.7, filed on May 10, 2017, the disclosures of which are incorporated herein by reference in their entireties.

FIELD OF THE INVENTION

The present invention relates to the field of materials and, specifically, relates to a thermal interface material, and preparation and application thereof.

BACKGROUND OF THE INVENTION

Thermal interface material connects the heat source and the heat sink by filling the air gap, and ensures that the heat generated by electronic device can be effectively transferred from heat source to heat sink to achieve a heat dissipation effect, thereby playing an important role in the electronic industry. The traditional thermal interface materials mainly refer to some polymer matrix filled with high thermal conductivity ceramic particles, such as aluminum nitride, boron nitride, aluminum oxide, etc., most of which have a thermal conductivity of 1-5 W/mK. However, with the rapid development of the electronic industry, it is difficult for the traditional thermal interface materials to solve the heat dissipation problems caused by the increased power density.

Carbon nanomaterials, such as carbon nanotubes and grapheme, have been widely used to solve heat dissipation problems due to their high thermal conductivity. For thermal interface materials, the traditional application method is to directly blend graphene or carbon nanotubes into a polymer matrix to achieve heat conduction enhancement effect. However, it is difficult for the longitudinal thermal conductivity of the resultant thermal interface material to exceed 10 W/mK, and it is inconsistent with the ultra-high intrinsic thermal conductivity of carbon nanomaterials. This is mainly because the thermal conductivity of low-dimensional materials such as carbon nanotubes and graphene is anisotropic, while the traditional blending method only randomly distributes these anisotropic fillers into the matrix, resulting in the poor utilization of this anisotropic property. In order to improve the utilization efficiency of such anisotropic thermal conductivity, when carbon nanotubes and graphene are currently used as reinforcing phases to improve thermal conductivity of thermal interface materials, it is mainly focused on constructing high-parallel vertical structures, such as vertical carbon nanotubes and vertical graphene structure.

The vertical carbon nanotube structure can be obtained by chemical vapor deposition (CVD), and the longitudinal thermal conductivity can exceed 30 W/mK. However, due to the strong matrix dependence, difficulty to improve the apparent density, and high interfacial thermal resistance (30-70 Kmm2/W) of vertical carbon nanotubes, the wide application of the vertical carbon nanotube material in the field of thermal interface is limited. Similar to vertical carbon nanotubes, vertical graphene structures can also be prepared by CVD method. Achour et al. (Applied Physics Letters 102.6 (2013): 061903) developed a vertical graphene nanowall on an aluminum nitride matrix with a thermal conductivity of up to 80 W/mK. However, the vertical graphene structure obtained by the CVD method is difficult to be effectively peeled from the aluminum nitride matrix, which severely limits its practical application. The vertical graphene structure can also be prepared by the oriented method, which can be divided into a micro-oriented method and a macro-oriented method. Wong et al. (Chemistry of Materials 28.17 (2016): 6096-6104) is a typical micro-oriented method using ice crystals to induce graphene oxide self-assembly to form vertical structure when aerogel forms; and the vertical grapheme/epoxy resin composite prepared by such method has a thermal conductivity of 2.13 W/mK and a very low graphene content. However, it is difficult to increase this extremely low content by self-assembly, which severely limits the upper limit of thermal conductivity of the product. Park et al. prepared a vertical graphene/polyvinylidene fluoride composite material by turning the horizontally arranged graphenes into vertical alignment via using L-shaped tubes, and the prepared vertical graphene/polyvinylidene fluoride composite materials have a thermal conductivity of about 10 W/MK. However, the vertical graphene structure prepared by such macro-oriented method is not very well arranged, and it is difficult to enlarge the scale of preparation, resulting in no practical application. In addition, the vertical graphene structure can also be prepared by reassembling graphene paper, such as rolling up graphene paper and slicing vertically, or rearranging graphene paper after slicing. Bai et al (Carbon 109 (2016): 552-557) rolled up commercial graphene paper, stuck it with PDMS and sliced it to prepare a thermal interface material with thermal conductivity of up to 600 W/mK. However, the elastic modulus of the material sample is also up to 500 Mpa, therefore it is not compressible and can not cope with the chip tolerance when multi-chip is used. Meanwhile, the material has high interface thermal resistance, so it is difficult to be used as a thermal interface material.

In summary, the vertical graphene thermal interface material does have high thermal conductivity, but the completely vertical graphene material does not have compressibility and it is difficult to be used as a thermal interface material. Therefore, there is an urgent need in the art to develop a high-performance graphene thermal interface material which can ensure high thermal conductivity and maintain compressibility.

SUMMARY OF THE INVENTION

The present invention provides a thermal interface material which combine excellent thermal conductivity and compressibility, and preparation and application thereof.

In the first aspect of the present invention, it provides a thermal interface material, which is obtained by bending and folding, optional horizontal pressing and optional high-temperature treatment of a laminated structure, wherein two-dimensional high-thermal-conductivity nano-sheets (or nano-plates) on the upper surface and the lower surface of the thermal interface material have a horizontal stack structure, and two-dimensional high-thermal-conductivity nano-sheets located in intermediate part between the upper surface and the lower surface of the thermal interface material have both a vertical stack structure and a curved stack structure.

In another preferred embodiment, "laminated structure" and "paper-like laminated macrostructure formed by horizontal stack of two-dimensional high thermal conductivity nano-sheet" are used interchangeably.

In another preferred embodiment, the thickness of the intermediate part of the thermal interface material is 60-99.8%, preferably 80-98%, and more preferably 84-90%, of the thickness of the thermal interface material.

In another preferred embodiment, the thickness of the upper surface of the thermal interface material is 0.1-20%, preferably 1-10%, and more preferably 5-8%, of the thickness of the thermal interface material.

In another preferred embodiment, the thickness of the lower surface of the thermal interface material is 0.1-20%, preferably 1-10%, more preferably 5-8%, of the thickness of the thermal interface material.

In another preferred embodiment, the thickness of the thermal interface material is 10-2000 μm, preferably 100-1500 μm, and more preferably 200-1000 μm.

In another preferred embodiment, the thickness of the upper surface of the thermal interface material is 1-100 μm, preferably 5-50 μm, and more preferably 10-30 μm.

In another preferred embodiment, the thickness of the lower surface of the thermal interface material is 1-100 μm, preferably 5-50 μm, and more preferably 10-30 μm.

In another preferred embodiment, the thickness of the intermediate part of the thermal interface material is 8-1800 μm, preferably 90-1400 μm, and more preferably 180-940 μm.

In another preferred embodiment, the expression "two-dimensional high-thermal-conductivity nano-sheets on the upper surface and the lower surface of the thermal interface material have a horizontal stack structure" means that two-dimensional high-thermal-conductivity nano-sheets on the upper surface and the lower surface of the thermal interface material have a stack structure substantially parallel to the horizontal plane (the angle between two surfaces is from −15° to 15°).

In another preferred embodiment, in the intermediate part of the thermal interface material, the volume ratio of vertical stack structure to curved stack structure is 1-9:1-9, preferably 2-8:2-8, and more preferably 3-7:3-7.

In another preferred embodiment, in the intermediate part of the thermal interface material, the volume content of the vertical stack structure is 10-90%, preferably 30-80%, and more preferably 60-90%.

In another preferred embodiment, in the intermediate part of the thermal interface material, the volume content of the curved stack structure is 10-90%, preferably 15-50%, and more preferably 15-40%.

In another preferred embodiment, the "vertical stack structure" refers to the structure that the two-dimensional high-thermal-conductivity nano-sheets of the intermediate part of the thermal interface material are stacked substantially perpendicular to horizontal plane.

In another preferred embodiment, the "curved stack structure" means that the two-dimensional high-thermal-conductivity nano-sheets of the intermediate part of the thermal interface material are of non-vertical stack structure (e.g., S-shaped arrangement).

In another preferred embodiment, the longitudinal thermal conductivity rate of the thermal interface material is 10-600 W/mK, preferably 80-480 W/mK, more preferably 100-300 W/mK, and most preferably 110-148 W/mK; and/or the compression ratio of the thermal interface material is 5-80%, preferably 8-50%, more preferably 10-40%, more preferably 10-35%, and most preferably 20-30%.

In another preferred embodiment, the density of the thermal interface material is 0.4-3.5 g/cm$^3$, preferably 0.6-2.4 g/cm$^3$, more preferably 1.0-2.2 g/cm$^3$, and most preferably 1.2-2.0 g/cm$^3$.

In another preferred embodiment, the thermal interface material has a structure as shown in FIG. 4.

In another preferred embodiment, the thermal interface material is prepared as follows:
  a-1) providing a laminated structure;
  a-2) processing the laminated structure based on a modulus mismatch principle, thereby obtaining a folded laminated structure;
  a-3) pressing the folded laminated structure at a first pressure in horizontal direction of the folded laminated structure, and then optionally annealing for a first time period at a first temperature, thereby obtaining the thermal interface material.

In another preferred embodiment, the laminated structure is prepared as follows:
  b-1) providing a first dispersion, the first dispersion comprises a first solvent and a high-thermal-conductivity nanomaterial dispersed in the first solvent;
  b-2) suction filtering and/or evaporating the first dispersion, thereby obtaining the laminated structure.

In another preferred embodiment, the first dispersion is stirred and/or ultrasonically treated.

In another preferred embodiment, the first solvent is selected from the group consisting of water, ethanol, N-methylpyrrolidone, N,N-dimethylformamide, N,N-dimethylacetamide, tetramethylsulfoxide, and combinations thereof.

In another preferred embodiment, the high-thermal-conductivity nanomaterial is selected from the group consisting of graphene, graphene oxide, boron nitride, expanded graphite sheet, carbonized/graphitized polyimide, and combinations thereof.

In another preferred embodiment, the laminated structure can be directly selected from commercial thermal conductive paper such as natural graphite paper, artificial graphite paper, artificial graphene paper, etc.

In another preferred embodiment, the first pressure is 0.1-15 MPa, preferably 1-12 MPa, and more preferably 1.5-11 MPa.

In another preferred embodiment, the first temperature is 25-3500° C., preferably 500-3400° C., more preferably 700-3300° C., more preferably 1500-3200° C., and most preferably 2600-3100° C.

In another preferred embodiment, the first time period of is 0.5-8 h, preferably 1-6 h, and more preferably 2-4 h.

In the second aspect of the present invention, it provides a thermal interface material, which only comprises the intermediate part of the thermal interface material according to the first aspect of the invention.

In another preferred embodiment, the thermal interface material is prepared as follows: after step a-3), removing the upper surface and lower surface of the thermal interface material according to the first aspect of the invention by mechanical processing, thereby obtaining the thermal interface material.

In another preferred embodiment, the "mechanical processing" is selected from the group consisting of cutting, polishing, etching, and combinations thereof.

In another preferred embodiment, the longitudinal thermal conductivity of the thermal interface material is 50-300 W/mK, preferably 80-250 W/mK, more preferably 100-200 W/mK, more preferably 120-180 W/mK, and most preferably 130-170 W/mK.

In another preferred embodiment, the compression ratio of the thermal interface material is 10-50%, preferably 15 to 40%, more preferably 20-30%, and most preferably 21-26%.

In another preferred embodiment, the density of the thermal interface material is 0.4-2.5 g/cm$^3$, preferably 0.6-2.0 g/cm$^3$, more preferably 0.8-1.6 g/cm$^3$, and most preferably 1-1.5 g/cm$^3$.

In the third aspect of the present invention, it provides a thermal interface material, which comprises:

1) a matrix, which is the thermal interface material according to the first aspect of the invention or the thermal interface material according to the second aspect of the invention; and 2) a filler, which is distributed on the surface and/or inside of the matrix.

In another preferred embodiment, the filler comprises polymeric material and optional thermal-conductivity reinforcing material.

In another preferred embodiment, the polymeric material is selected from the group consisting of elastic material, non-elastic material, and combinations thereof.

In another preferred embodiment, the elastic material is selected from the group consisting of silica gel, rubber, latex, and combinations thereof.

In another preferred embodiment, the non-elastic material is selected from the group consisting of polyimide, epoxy resin, polypropylene, polyethylene, polyphenylene sulfide, polyamide, poly carbonate, polyvinyl chloride, and combinations thereof.

In another preferred embodiment, the thermal-conductivity reinforcing material is selected from the group consisting of boron nitride particles, boron nitride nanosheets, aluminum nitride particles, alumina particles, silicon oxide particles, silicon carbide particles, diamond particles, graphene, carbon nanotubes, metal particles, and combinations thereof.

In another preferred embodiment, the metal particles are selected from the group consisting of copper particles, silver particles, iron particles, aluminum particles, and combinations thereof.

In another preferred embodiment, the particle size of the thermal-conductivity reinforcing material is 0.1-300 μm, preferably 1-20 μm.

In another preferred embodiment, the shape of the thermal-conductivity reinforcing material is selected from the group consisting of sphere, sheet, irregular polygon, and combinations thereof.

In another preferred embodiment, the upper limit of the mass content of the thermal-conductivity reinforcing material in the filler is selected from the group consisting of 98 wt %, 97 wt %, and 96 wt %.

In another preferred embodiment, the lower limit of the mass content of the thermal-conductivity reinforcing material in the filler is selected from the group consisting of 0 wt %, 10 wt %, 20 wt %, 30 wt %, 40 wt %, 50 wt %, and 60 wt %.

In another preferred embodiment, when the filler is distributed on the surface of the matrix, the thickness of coating is 0.5-5 μm, preferably 1-3 μm.

In another preferred embodiment, in the thermal interface material, the mass ratio of the matrix to the filler is 1-25, preferably 1-20, and more preferably 1-16.

In another preferred embodiment, in the thermal interface material, the volume ratio of the matrix to the filler is 300-800, preferably 400-600.

In another preferred embodiment, the longitudinal thermal conductivity of the thermal interface material is 100-800 W/mK, preferably 150-600 W/mK, more preferably 200-550 W/mK, and most preferably 250-500 W/mK.

In another preferred embodiment, the compression ratio of the thermal interface material is 8-30%, preferably 10-20%, and more preferably 11-16%.

In another preferred embodiment, the density of the thermal interface material is 0.4-2.5 g/cm$^3$, preferably 1-2 g/cm$^3$, and most preferably 1.5-2 g/cm$^3$.

In the fourth aspect of the present invention, it provides a method of preparing the thermal interface material according to the first aspect of the invention, which comprises the following steps:

b-1) providing a laminated structure;

b-2) processing the laminated structure based on modulus mismatch principle, thereby obtaining a folded laminated structure;

b-3) pressing the folded laminated structure at a first pressure in horizontal direction of the folded laminated structure, then optionally annealing for a first time period at a first temperature, thereby obtaining the thermal interface material.

In another preferred embodiment, the expression "processing the laminated structure based on modulus mismatch principle" refers to the processing technology in which the laminated structure is bonded to low-modulus pre-stretched elastic body fixed by external force with Van der Waals force, then the external force is removed, and the laminated structure is folded.

In the fifth aspect of the present invention, it provides a method of preparing the thermal interface material according to the third aspect of the invention, which comprises the following steps:

b-1) providing a first slurry and a matrix which is the thermal interface material according to the first aspect of the invention or the thermal interface material according to the second aspect of the invention, wherein the first slurry comprises polymeric material and optional thermal-conductivity reinforcing material;

b-2) filling or coating the matrix with the first slurry, and curing, thereby obtaining the thermal interface material.

In another preferred embodiment, the term "curing" refers to a high temperature treatment at a second temperature for a second time period.

In another preferred embodiment, the second temperature is 25-350° C., preferably 80-320° C.

In another preferred embodiment, the second time period is 0.5-16 h, preferably 1-5 h. In another preferred embodiment, the aim of "curing" is to crosslink the polymeric material by high temperature treatment to form a polymer matrix.

In the sixth aspect of the present invention, it provides an article, which comprises one or more components selected from the group consisting of:

1) the thermal interface material according to the first aspect of the invention;

2) the thermal interface material according to the second aspect of the invention; and 3) the thermal interface material according to the third aspect of the invention.

In another preferred embodiment, the article is selected from the group consisting of thermal-conductivity pad, uniform heat sheet, and Joule heating sheet.

It should be understood that, in the present invention, each of the technical features specifically described above and below (such as those in the Examples) can be combined with each other, thereby constituting new or preferred technical solutions which need not be specified again herein.

DESCRIPTION OF THE DRAWINGS

FIG. 8 shows a comparison of the properties of thermal interface material 2 and commercial thermal interface material (Fujipoly XR-m, 17 W/mK), wherein FIG. 8a is schematic diagram of the test, FIG. 8b is the temperature-rising curve of heat source, and FIG. 8c is infrared thermogram of equilibrium temperature of heat source.

EMBODIMENTS FOR CARRYING OUT THE INVENTION

Figure 1:
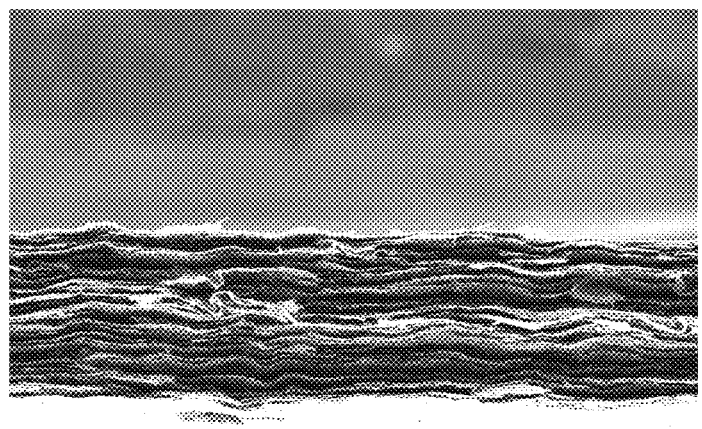
FIG. 1 is a scanning electron micrograph of side view of the internal structure of graphene paper obtained in the step (b) of Example 1.

Based on a long-term and intensive research, the inventors have unexpectedly prepared a thermal interface material with excellent thermal conductivity and compressibility. The thermal interface material has excellent thermal conductivity and compressibility, and the preparation method has the characteristics of simple process, low cost, safety and environmental protection, and therefore the thermal interface material can effectively solve the heat dissipation problem of electronic industrial product. On this basis, the inventors have completed the present invention.

Terms

As used herein, the term "modulus mismatch principle" refers to a behavior that the high modulus objects are bent and folded due to shrinkage deformation of low modulus objects when two materials with different modulus closely adhere to each other due to Van Der Waals force. The present invention specifically refers to a behavior that high-thermal-conductivity paper (such as graphene paper, boron nitride paper, natural graphite paper, artificial graphene paper, etc.) adhered to low modulus pre-stretched elastomer (such as silica gel, latex, polyacrylic acid pressure sensitive adhesive, etc.) is bent and folded due to shrinkage of the elastomer.

Thermal Interface Material

The present invention provides a thermal interface material, which is obtained by bending and folding, optional horizontal pressing and optional high-temperature treatment of a laminated structure, wherein the two-dimensional high-thermal-conductivity nano-sheets on the upper surface and the lower surface of the thermal interface material have a horizontal stack structure, and the two-dimensional high-thermal-conductivity nano-sheets located in intermediate part between the upper surface and the lower surface of the thermal interface material have both a vertical stack structure and a curved stack structure.

It should be understood that the thermal interface material of the present invention is prepared by using a specific "modulus mismatch principle" with respect to the existing thermal interface material, so that the intermediate part of the thermal interface material has both a vertical arrangement structure and a curved arrangement structure (i.e., a non-vertical arrangement structure), wherein the vertical arrangement structure can effectively ensure high thermal conductivity of the thermal interface material, and the curved vertical arrangement structure can ensue excellent compressibility of the thermal interface material.

Preferably, the thickness of the intermediate part of the thermal interface material is 60-99.8% of the thickness of the thermal interface material. When the ratio is <60%, the longitudinal thermal conductivity of the corresponding thermal interface material is less than 10 W/mK.

Preferably, the volume content of the vertical arrangement structure (or vertical stack structure) is 10-90% in the intermediate part of the thermal interface material. When the ratio is <10%, the longitudinal thermal conductivity of the corresponding thermal interface material is less than 10 W/mK; when the ratio is >90%, the corresponding thermal interface material can not be compressed under a standard packaging pressure.

Preferably, the volume content of the curved arrangement structure (or curved stack structure) is 10-90% in the intermediate part of the thermal interface material. When the ratio is <10%, the corresponding thermal interface material can not be compressed under a standard packaging pressure; when the ratio is >90%, the longitudinal thermal conductivity of the corresponding thermal interface material is less than 10 W/mK.

In addition, based on the above thermal interface material, the present invention also provides the following two thermal interface materials:

The first thermal interface material, which only comprises the intermediate part of the above thermal interface material.

In another preferred embodiment, the thermal interface material is prepared as follows: after step a-3), removing the upper surface and lower surface of the above thermal interface material by mechanical processing, thereby obtaining the thermal interface material.

In another preferred embodiment, the "mechanical processing" is selected from the group consisting of cutting, polishing, etching, and combinations thereof.

The second thermal interface material, which comprises:
1) the above thermal interface material or the first thermal interface material which is used as a matrix;
2) a filler, which is distributed on the surface and/or inside of the matrix.

In another preferred embodiment, the filler comprises polymeric material and optional thermal-conductivity reinforcing material.

Preparation Method

The present invention also provides a method of preparing the thermal interface material according to the first aspect of the invention, comprising the following steps:

b-1) providing a laminated structure;

b-2) processing the laminated structure based on a modulus mismatch principle, thereby obtaining a folded laminated structure;

b-3) pressing the folded laminated structure at a first pressure in horizontal direction of the folded laminated structure, then optionally annealing for a first time period at a first temperature, thereby obtaining the thermal interface material.

It should be understood that in the process of processing the laminated structure based on the "modulus mismatch principle", the laminated structure is bonded to the pre-stretched elastomer (such as silica gel, latex, polyacrylate pressure sensitive adhesive, etc.) by Van Der Waals force, wherein the elastomer is pre-stretched (the stretching amount is about 100-500% of the unstretched elastomer) before bonding the laminate structure, the (elastic) modulus is about 0.01-0.5 MPa, and the (elastic) modulus of the laminated structure (or high thermal-conductivity paper) is about 1 to 30 MPa. In the above processing, since the elastomer is pre-stretched, the pre-stretched elastomer always requires external force fixation during bonding the laminated structure. After the laminated structure is bonded with the pre-stretched elastomer, the external force is removed, then the laminated structure is folded. Correspondingly, the present invention also provides a second method of preparing the above thermal interface material accordingly, which comprises the following steps:

b-1) providing a first slurry and a matrix which is the above thermal interface material or the second thermal interface material, wherein the first slurry comprises a polymeric material and an optional thermal-conductivity reinforcing material;

b-2) filling or coating the matrix with the first slurry, and curing, thereby obtaining the thermal interface material.

Application

The present invention also provides an article, which comprises one or more components selected from the group consisting of:

1) the above thermal interface material;
2) the first thermal interface material;
3) the second thermal interface material.

In another preferred embodiment, the article comprises (but is not limited to) thermal-conductivity pad, uniform heat sheet, and Joule heating sheet.

Compared with the Prior Art, the Main Advantages of the Present Invention Include:

1. The thermal interface material has both excellent thermal conductivity and compressibility. Specifically, the longitudinal thermal conductivity of the thermal interface material is 10-600 W/mK and the compression ratio of the thermal interface material is 5-80%;

(2) The pure carbon-based thermal interface material in the thermal interface material can be used at a high temperature, wherein the highest temperature in the air can be up to 400° C., and the highest temperature in the vacuum can be up to 3000° C.;

(3) The pure carbon-based thermal interface material in the thermal interface material can be used in a strong corrosive environment;

(4) The preparation method has the characteristics of simple process, low cost, safety and environmentally friendly;

(5) The preparation method is easy to enlarge and industrialize.

The present invention will be further illustrated below with reference to the specific examples. It should be understood that these examples are only to illustrate the invention but not to limit the scope of the invention. The experimental methods with no specific conditions described in the following examples are generally performed under the conventional conditions, or according to the manufacturer's instructions. Unless indicated otherwise, parts and percentage are calculated by weigh.

Unless indicated otherwise, all professional and scientific terms used herein have the same meaning as those familiar to the skilled in the art. In addition, any methods and materials similar or equivalent to those described can be used in the method of the present invention. The preferred embodiments and materials described herein are for illustrative purposes only.

General Raw Materials

Graphene powder: in the preparation method of the present invention, the graphene powder used is not particularly limited. Preferably, the number of graphene layers of the graphene powder is 5-50 layers. Preferably, the graphene plane size of graphene powder is 5-30 μm.

Graphene oxide powder: in the preparation method of the present invention, the graphene oxide of the graphene oxide powder used is not particularly limited. Preferably, the number of graphene oxide layers is 1-5 layers. Preferably, the graphene oxide plane size is 5-30 μm.

Silica gel: in the preparation method of the present invention, the silica gel used is not particularly limited. Preferably, the silica gel is Dow Corning 184 silica gel.

Boron Nitride: in the preparation method of the present invention, boron nitride used is not particularly limited. Preferably, the boron nitride is hexagonal boron nitride with a size of 1-10 μm.

Polyimide: in the preparation method of the present invention, the polyimide used is not particularly limited. Preferably, the polyimide is a fully aromatic polyimide.

Aluminum nitride: in the preparation method of the present invention, the aluminum nitride used is not particularly limited. Preferably, the aluminum nitride size is 1-10 μm.

Boron nitride nano-sheet: in the preparation method of the present invention, the boron nitride nano-sheet used is peeled from hexagonal boron nitride. Preferably, the number of layers is 1-30 layers and the size is 0.1-10 μm.

Artificial graphite paper: in the preparation method of the present invention, the artificial graphite paper used is made of polyimide film through carbonization-graphitization. preferably, the thickness of artificial graphite paper is 12-100 μm.

Natural graphite paper: in the preparation method of the present invention, the natural graphite paper used is made of expanded graphite sheet by calenderation or rolling. Preferably, the thickness of natural graphite paper is 12-100 μm.

General Test Method

Density

Weighing method: the density is obtained by dividing the mass of the weighed sample by the volume of the measured sheet sample.

Longitudinal Thermal Conductivity Measuring device: LFA467, NETZSCH, Germany; Measuring standard: ASTM E 1461.

Compression Ratio

Measuring device: UTM, 5567A, Instron, USA; Measurement standard: GB1040-92.

Example 1. Pure Carbon-Based Duplex Structure Graphene Thermal Interface Material 1

(a) For a concentration of 3 mg/ml, 300 mg of graphene powder was weighed, and the above powder was dispersed in 300 ml of ethanol solution. The mixture was stirred thoroughly, and then ultrasonically treated to obtain a uniformly dispersed graphene dispersion;

(b) the graphene dispersion obtained in the step (a) was subjected to suction filtration to obtain graphene paper;

(c) the graphene paper obtained in the step (b) was pasted on a pre-stretched (400%×400%) polyacrylate pressure sensitive adhesive, and then the pressure sensitive adhesive was recovered to obtain a folded graphene paper;

(d) the folded graphene paper obtained in the step (c) was subjected to a pressure of 10 MPa in the horizontal direction and then annealed at 3000° C. for 3 hours to obtain a graphene matrix 1, i.e., a pure carbon-based duplex structure graphene thermal interface material 1. After testing, the density of the graphene matrix 1 was 1.62 g/cm$^3$, the longitudinal thermal conductivity was 300 W/mK, and the compression ratio was 12%.

FIG. 1 was a scanning electron micrograph of side view of the internal structure of graphene paper obtained in the step (b) of Example 1.

It could be seen from FIG. 1 that the graphene nano-sheets in the prepared graphene paper had a horizontal stack structure.

Figure 2:
FIG. 2 is a physical diagram of the graphene thermal interface material 1 obtained in the step (d) of Example 1.

FIG. 2 was a physical diagram of the graphene thermal interface material 1 obtained in the step (d) of Example 1.

It could be seen from FIG. 2 that the prepared graphene thermal interface material had certain flexibility.

Figure 3:
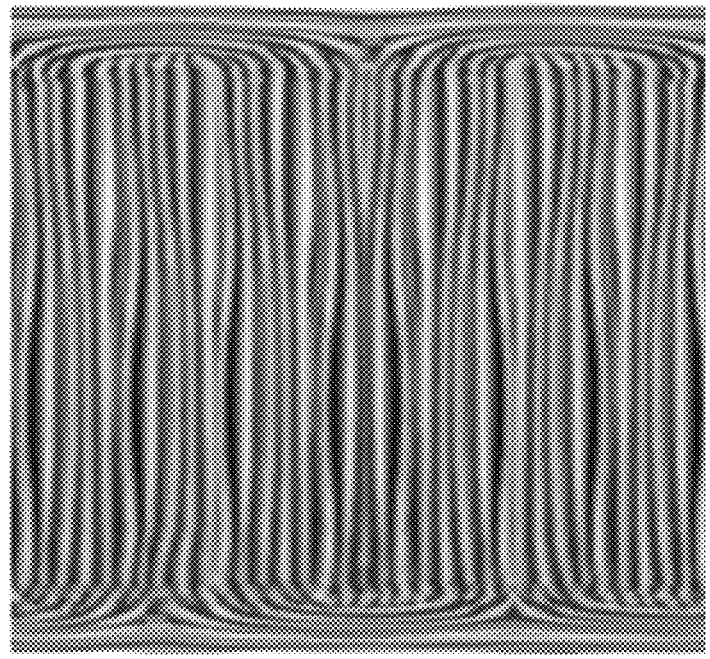
FIG. 3 is a structural schematic diagram of the thermal interface material 1 obtained in Example 1.

In order to better understand the prepared pure carbon-based duplex structure graphene thermal interface material 1, the structural schematic diagram of the composite structure was drawn. As shown in FIG. 3, the graphene tended to be vertically arranged in the interior of pure carbon-based duplex structure graphene thermal interface material 1, while the graphene nano-sheets on the upper and lower surfaces tended to be arranged horizontally.

Figure 4:
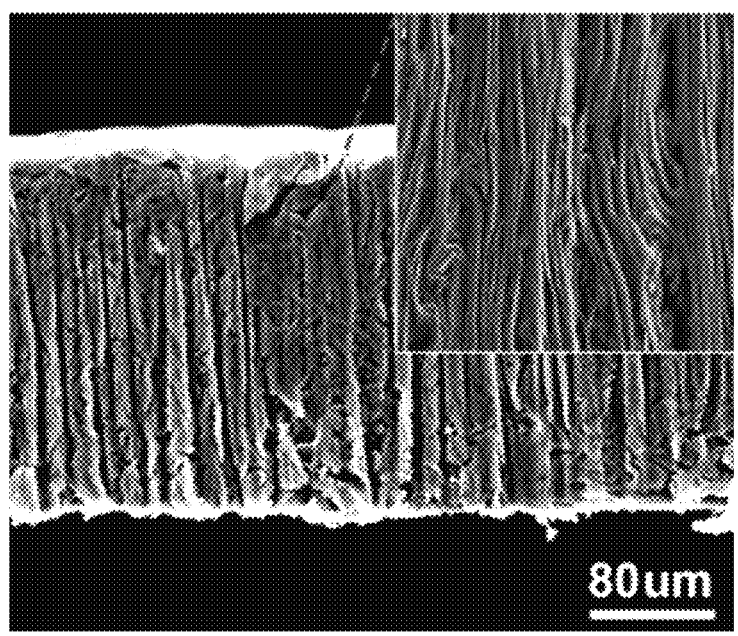
FIG. 4 is a scanning electron micrograph of structure global view of the pure carbon-based duplex structure graphene thermal interface material 1 obtained in Example 1, wherein the upper right corner is a partially enlarged view.

FIG. 4 was a scanning electron micrograph of structure global view of the pure carbon-based duplex structure graphene thermal interface material 1 obtained in Example 1, wherein the upper right corner was a partially enlarged view.

It could be seen from FIG. 4 that the graphene tended to be vertically arranged in the interior of prepared pure carbon-based duplex structure graphene thermal interface material 1, while the upper surface and lower surface had a thin layer of approximately horizontally arranged graphene nano-sheets. Further, after testing, the upper surface (i.e., the portion arranged approximately horizontally) thickness of the thermal interface material 1 was 20 μm, and the thickness of intermediate part (i.e., the inner vertical arrangement portion) was 260 μm, and the thickness of lower surface (i.e., the portion arranged approximately horizontally) was 20 μm. Further, it could be seen from the partial enlarged view that the intermediate part of the thermal interface material 1 had both vertical arrangement structure and curved arrangement structure, and the volume content of the vertical arrangement structure and the curved arrangement structure was 75-85% and 15-25%, respectively.

Figure 5:
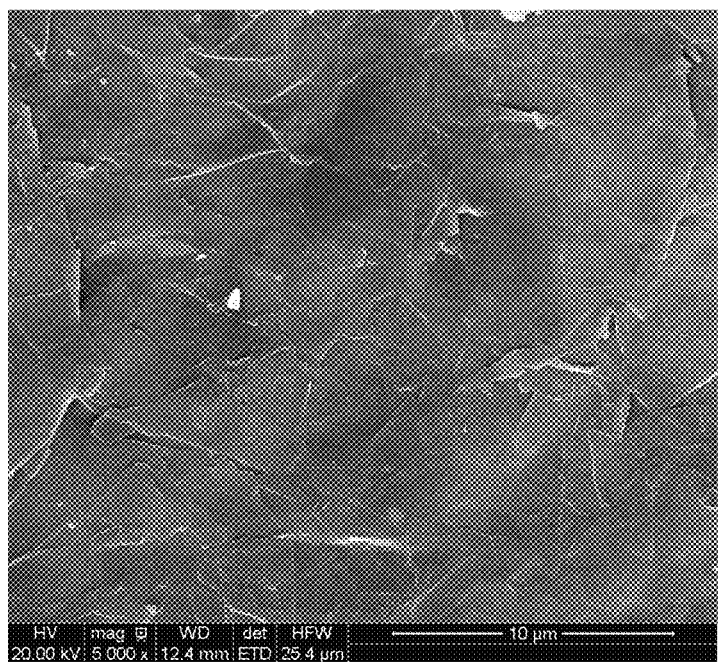
FIG. 5 is a scanning electron micrograph of surface structure top view of the pure carbon-based duplex structure graphene thermal interface material 1 obtained in Example 1.

FIG. 5 was a scanning electron micrograph of surface structure top view of the pure carbon-based composite structure graphene thermal interface material 1 obtained in Example 1.

It could be seen from FIG. 5 that the surface of the prepared pure carbon-based composite structure graphene thermal interface material 1 was of horizontal arrangement structure.

Example 2. Pure Carbon Based Composite Structure Graphene Thermal Interface Material 2

The pure carbon-based duplex structure graphene thermal interface material 2 was prepared by the same method of Example 1, except that the mechanical pressure in the step (d) was 2 MPa.

After testing, the density of the pure carbon-based duplex structure graphene thermal interface material 2 was 1.32 g/cm$^3$, the longitudinal thermal conductivity was 115 W/mK, and the compression ratio was 27%.

Figure 6:
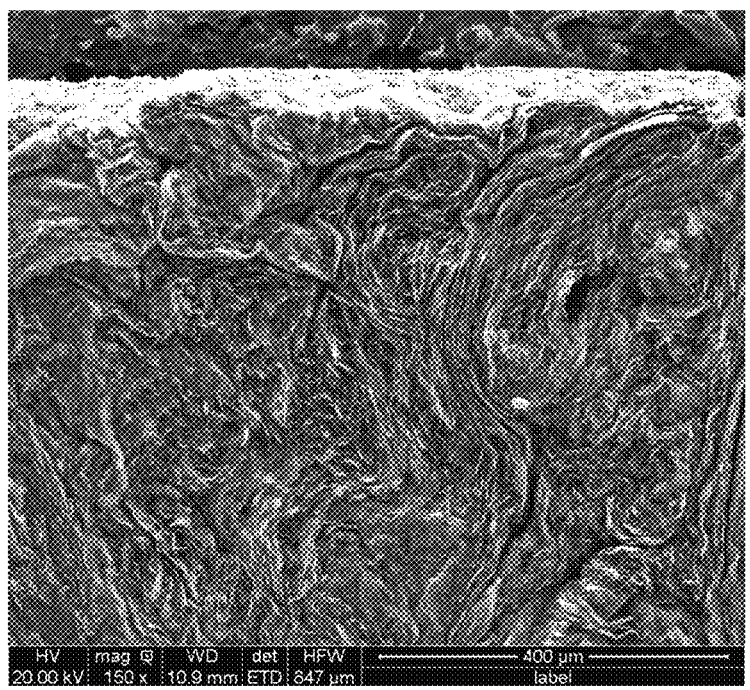
FIG. 6 is a scanning electron micrograph of longitudinal sectional view of curved arrangement structure in intermediate part of pure carbon-based duplex structure graphene thermal interface material 2 obtained in Example 2.

FIG. 6 was a scanning electron micrograph of longitudinal sectional view of curved arrangement structure in intermediate part of pure carbon-based duplex structure graphene thermal interface material 2 obtained in Example 2.

It could be seen from FIG. 6 that some graphenes in the pure carbon-based duplex structure graphene thermal interface material 2 were S-shape non-vertical arrangement, which was a necessary condition for the prepared graphene matrix to maintain compressibility with high thermal conductivity Example 3. Pure Carbon-Based Duplex Structure Graphene Thermal Interface Material 3

The pure carbon based duplex structure graphene thermal interface material 3 was prepared by the same method of Example 2, except that after step (d), the upper surface and lower surface of the graphene matrix 1 were removed (the removal could be achieved by cutting and/or polishing the graphene matrix 1), and only the internal graphene structure was retained (i.e., only the non-horizontal arrangement portion of the graphene matrix 1 was retained).

After testing, the density of the obtained pure carbon-based duplex structure graphene thermal interface material 3 was 1.30 g/cm$^3$, the longitudinal thermal conductivity was 158 W/mK, and the compression ratio was 23%.

Figure 7:
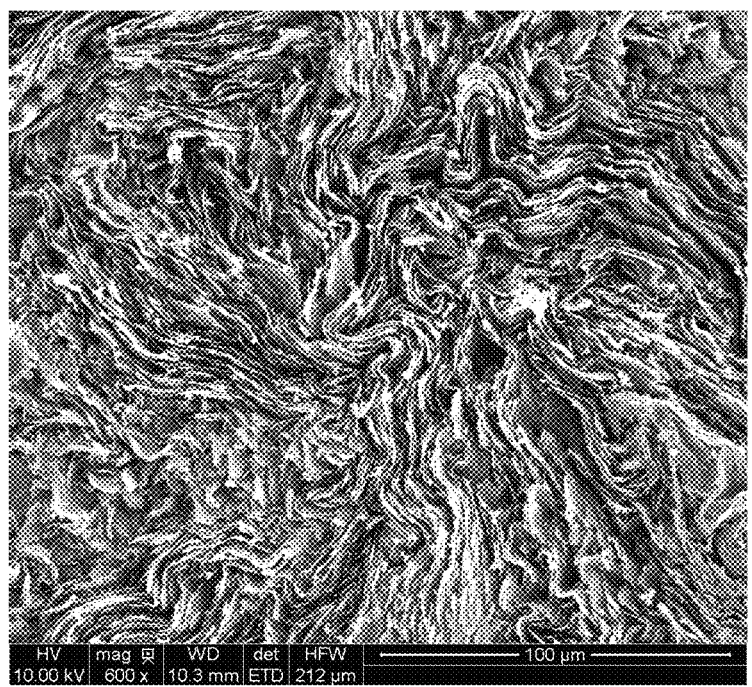
FIG. 7 is a scanning electron micrograph of top view of pure carbon-based duplex structure graphene thermal interface material 3 obtained in Example 3.

FIG. 7 was a scanning electron micrograph of top view of pure carbon-based duplex structure graphene thermal interface material 3 obtained in Example 3.

It could be seen from FIG. 7 that the interior of the prepared pure carbon-based duplex structure graphene thermal interface material 3 tended to be vertically arrangement structure, which was a necessary condition for the graphene matrix to have high thermal conductivity.

Example 4. Pure Carbon-Based Duplex Structure Graphene Thermal Interface Material 4

The pure carbon based duplex structure graphene thermal interface material 4 was prepared by the same method of Example 1, except that the mechanical pressure was 0.1 MPa and the annealing temperature was 800° C. in the step (d).

After testing, the density of the obtained pure carbon-based duplex structure graphene thermal interface material 4 was 0.7 g/cm$^3$, the longitudinal thermal conductivity was 10 W/mK, and the compression ratio was 80%.

Example 5 Pure Carbon-Based Duplex Structure Graphene Thermal Interface Material 5

(a) For a concentration of 3 mg/ml, 300 mg of graphene oxide powder was weighed, and the above powder was dispersed in 300 ml of deionized water solution. The mixture was stirred thoroughly, and then ultrasonically treated to obtain a uniformly dispersed graphene oxide dispersion;

(b) the graphene oxide dispersion obtained in the step (a) was subjected to suction filtration to obtain graphene oxide paper;

(c) the graphene oxide paper obtained in the step (b) was processed by modulus mismatch principle to obtain a folded graphene oxide paper;

(d) the folded graphene oxide paper obtained in the step (c) was subjected to a pressure of 10 MPa in the horizontal direction and then annealed at 3000° C. for 3 hours to obtain the pure carbon-based duplex structure graphene thermal interface material 5.

The obtained pure carbon-based duplex structure graphene thermal interface material 5 was a pure carbon-based material prepared from graphene oxide as raw material and assisted by high temperature graphitization.

After testing, the density of the pure carbon-based duplex structure graphene thermal interface material 5 was 1.85 g/cm$^3$, the longitudinal thermal conductivity was 600 W/mK, and the compression ratio was 7%.

Example 6. Duplex Structure Graphene-Based Thermal Interface Material 6

The duplex structure graphene-based thermal interface material 6 was prepared by the same method of Example 1, except that after Example 1, silica gel was mixed with 60 wt % of boron nitride (boron nitride particle size was 5 μm) to obtain a silica gel/boron nitride slurry. The slurry was then filled in the graphene matrix 1 obtained in the step (d) and then cured (the curing was carried out by processing at 100° C. for 2 h) to obtain the duplex structure graphene-based thermal interface material 6.

The duplex structure graphene-based thermal interface material 6 was a composite material of graphene matrix 1 and elastic silica gel/boron nitride, wherein the addition of silica gel was to improve the mechanical properties of the material.

After testing, the density of the duplex structure graphene-based thermal interface material 6 was 1.74 g/cm$^3$, the longitudinal thermal conductivity was 320 W/mK, and the compression ratio was 150%.

Furthermore, the mass ratio of graphene matrix 1 to filler (silica gel+boron nitride) was about 1.62:0.12 in thermal interface material 6.

Example 7. Duplex Structure Graphene-Based Thermal Interface Material 7

The duplex structure graphene-based thermal interface material 7 was prepared by the same method of Example 1, except was that after Example 1, silica gel was mixed with 60 wt % boron nitride nano-plates to obtain a silica/boron nitride nano-sheets slurry. The slurry was then coated on the surface of the graphene matrix 1 obtained in the step (d) with a coating thickness of 2 μm, and then cured (the curing was carried out by processing at 100° C. for 2 h) to obtain the duplex structure graphene-based thermal interface material. 7.

The duplex structure graphene-based thermal interface material 7 was a silica gel composite material/graphene matrix 1/silica gel composite material sandwich structure material (silica gel composite material referred to silica gel/boron nitride), wherein the surface coating of silica gel composite material was to improve the insulation properties of the thermal interface material, so the material could be used for heat conductive insulation.

After testing, the density of the duplex structure graphene-based thermal interface material 7 was 1.61 g/cm$^3$, the longitudinal thermal conductivity was 280 W/mK, and the compression ratio was 12%.

Furthermore, the volume ratio of graphene matrix 1 to filler (silica gel+boron nitride) was about 500 in thermal interface material 7.

Example 8. Duplex Structure Graphene-Based Thermal Interface Material 8

The duplex structure graphene-based thermal interface material 8 was prepared by the same method of Example 5, except that after Example 5, polyimide was filled in the pure carbon-based duplex structure graphene thermal interface material 5 obtained in the step (d), and then cured (the curing was carried out by processing at 100, 200, and 300° C. for 1 h, respectively) to obtain the duplex structure graphene-based thermal interface material 8.

The obtained duplex structure graphene-based thermal interface material 8 was a composite material of pure carbon-based duplex structure graphene thermal interface material 5 and non-elastic polyimide.

After testing, the density of the duplex structure graphene-based thermal interface material 8 was 1.92 g/cm$^3$, the longitudinal thermal conductivity was 520 W/mK, and the compression ratio was 5%.

Furthermore, the mass ratio of thermal interface material 5 to filler (polyimide) was about 1.62:0.30 in thermal interface material 8.

Example 9 Duplex Structure Graphene-Based Thermal Interface Material 9

The duplex structure graphene-based thermal interface material 9 was prepared by the same method of Example 5, except that after Example 5, polyimide was mixed with 96 wt % of aluminum nitride (aluminum nitride particle size was 5 μm) to obtain a polyimide/aluminum nitride slurry, the slurry was then filled in the pure carbon-based duplex structure graphene thermal interface material 5 obtained in the step (d), and then cured (the curing was carried out by processing at 100, 200, and 300° C. for 1 h, respectively) to obtain the duplex structure graphene-based thermal interface material 9.

The obtained duplex structure graphene-based thermal interface material 9 was a composite material of pure carbon-based duplex structure graphene thermal interface material 5 and thermal-conductivity insulating slurry.

After testing, the density of the duplex structure graphene-based thermal interface material 9 was 2.2 g/cm$^3$, the longitudinal thermal conductivity was 540 W/mK, and the compression ratio was 5%.

Furthermore, the mass ratio of thermal interface material 5 to filler (polyimide+aluminum nitride) was about 1.62: 0.58 in thermal interface material 9.

Example 10. Duplex Structure Graphene-Based Thermal Interface Material 10

The duplex structure graphene-based thermal interface material 10 was prepared by the same method of Example 8, except was that elastic silica gel matrix was replaced with non-elastic polyimide.

The obtained duplex structure graphene-based thermal interface material 10 was a composite material of pure carbon-based duplex structure graphene thermal interface material 5 and elastic silica gel.

After testing, the density of the duplex structure graphene-based thermal interface material 10 was 1.91 g/cm$^3$, the longitudinal thermal conductivity was 480 W/mK, and the compression ratio was 11%.

Furthermore, the mass ratio of thermal interface material 5 to filler (silica gel matrix) was about 1.62:0.29 in thermal interface material 10.

Example 11 Thermal Interface Material 11

(a) For a concentration of 3 mg/ml, 300 mg of boron nitride nano-sheets powder was weighed, and the above powder was dispersed in 300 ml of deionized water solution. The mixture was stirred thoroughly, and then ultrasonically treated to obtain a uniformly dispersed boron nitride nano-sheets dispersion;

(b) the boron nitride nano-sheets dispersion obtained in the step (a) was subjected to suction filtration to obtain boron nitride nano-sheets paper;

(c) the boron nitride obtained in the step (b) was pasted on a pre-stretched (400%×400%) polyacrylate pressure sensitive adhesive, and then the pressure sensitive adhesive was recovered to obtain a folded boron nitride paper;

(d) the folded boron nitride paper obtained in the step (c) was subjected to a pressure of 10 MPa in the horizontal direction to obtain the boron nitride matrix 1;

(e) the silica gel was filled in the boron nitride matrix 1 obtained in the step (d) to obtain the thermal interface material 11.

After testing, the density of the thermal interface material 11 was 3.12 g/cm$^3$, longitudinal thermal conductivity was 30 W/mK, and compression ratio was 8%.

Example 12. Thermal Interface Material 12

The thermal interface material 12 was prepared by the same method of Example 1, except that the graphene paper prepared in the steps (a) and (b) was replaced with commercial natural graphite paper (commercial natural graphite paper was formed by calenderation of expanded graphite sheets).

After testing, the density of the thermal interface material 12 was 1.13 g/cm$^3$, longitudinal thermal conductivity was 160 W/mK, and compression ratio was 13%.

Example 13 Thermal Interface Material 13

The thermal interface material 13 was prepared by the same method of Example 1, except that the graphene paper prepared in the steps (a) and (b) was replaced with commercial artificial graphite paper (commercial artificial graphite paper was formed by carbonization/graphitization of polyimide).

After testing, the density of the thermal interface material 13 was 1.37 g/cm$^3$, longitudinal thermal conductivity was 310 W/mK, and compression ratio was 14%.

Example 14

Figure 8:
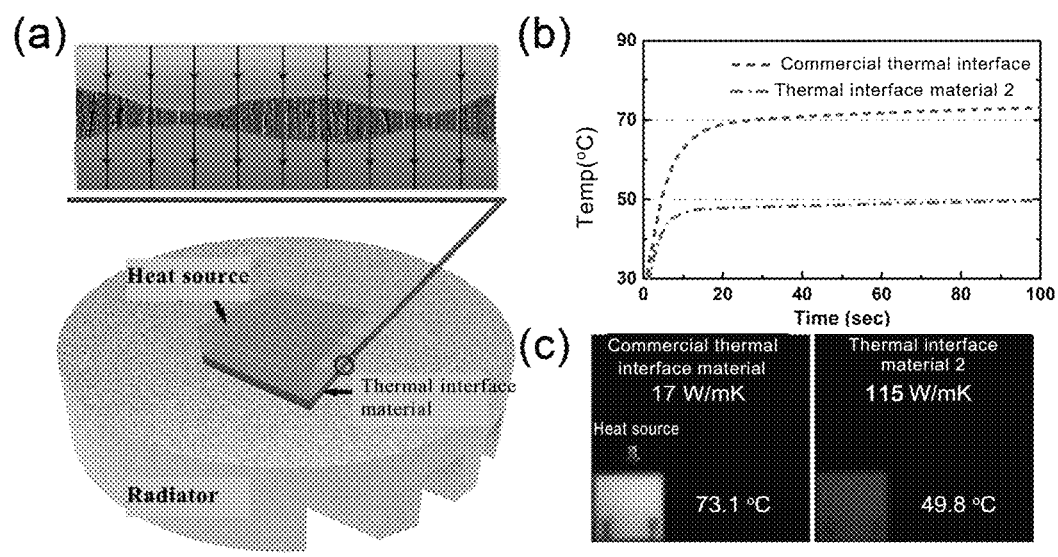

FIG. 8 was a comparison of the properties of thermal interface material 2 and commercial thermal interface material (Fujipoly XR-m, 17 W/mK), wherein FIG. 8a was schematic diagram of the test, FIG. 8b was the temperature-rising curve of heat source, and FIG. 8c was infrared thermogram of equilibrium temperature of heat source.

It could be seen from FIG. 8b that the final equilibrium temperature of the heat source using the thermal interface material 2 was far lower than the heat source temperature using the commercial thermal interface material.

It could be seen from FIG. 8c, the thermal interface material 2 had significant advantages in thermal management over commercial thermal interface materials.

The performance parameters of the thermal interface materials obtained in Examples 1-13 are summarized in Table 1 below.

TABLE 1

| | Volume content of vertical arrangement structure (%) | Volume content of curved arrangement structure (%) | Density (g/cm$^3$) | Longitudinal thermal conductivity (W/mK) | compression ratio |
| --- | --- | --- | --- | --- | --- |
| Example1 | 75-85 | 15-25 | 1.62 | 300 | 12% |
| Example2 | 60-70 | 30-40 | 1.32 | 115 | 27% |
| Example3 | 80-90 | 10-20 | 1.30 | 158 | 23% |
| Example4 | 10-30 | 70-90 | 0.7 | 10 | 80% |
| Example5 | 75-85 | 15-25 | 1.85 | 600 | 7% |
| Example6 | 75-85 | 15-25 | 1.74 | 320 | 15% |
| Example7 | 75-85 | 15-25 | 1.61 | 280 | 12% |
| Example8 | 75-85 | 15-25 | 1.92 | 520 | 5% |
| Example9 | 75-85 | 15-25 | 2.2 | 540 | 5% |
| Example10 | 75-85 | 15-25 | 1.91 | 480 | 11% |
| Example11 | 75-85 | 15-25 | 3.12 | 30 | 8% |
| Example12 | 75-85 | 15-25 | 1.13 | 160 | 13% |
| Example13 | 75-85 | 15-25 | 1.37 | 310 | 14% |

All literatures mentioned in the present application are incorporated herein by reference, as though each one is individually incorporated by reference. Additionally, it should be understood that after reading the above teachings, those skilled in the art can make various changes and modifications to the present invention. These equivalents also fall within the scope defined by the appended claims.

The invention claimed is:

1. A thermal interface material, which is obtained by bending and folding, optional horizontal pressing and optional high-temperature treatment of a laminated structure, wherein two-dimensional nano-sheets on the upper surface and the lower surface of the thermal interface material have a horizontal stack structure, and two-dimensional nano-sheets located in intermediate part between the upper surface and the lower surface of the thermal interface material have both a vertical stack structure and a curved stack structure.

2. The thermal interface material of claim 1, wherein the thickness of the intermediate part of the thermal interface material is 60-99.8% of the thickness of the thermal interface material.

3. The thermal interface material of claim 1, wherein in the intermediate part of the thermal interface material, the volume ratio of vertical stack structure to curved stack structure is 1-9:1-9.

4. The thermal interface material of claim 1, wherein the longitudinal thermal conductivity rate of the thermal interface material is 10-600 W/mK; and/or
the compression ratio of the thermal interface material is 5-80%.

5. A thermal interface material, which only comprises the intermediate part of the thermal interface material of claim 1.

6. A thermal interface material, which comprises:
 1) a matrix, which is a thermal interface material of claim 1 or an intermediate part thereof; and
 2) a filler, which is distributed on the surface and/or inside of the matrix.

7. A method of preparing the thermal interface material of claim 1, comprising the following steps:
 b-1) providing a laminated structure;
 b-2) processing the laminated structure based on modulus mismatch principle, thereby obtaining a folded laminated structure; and
 b-3) pressing the folded laminated structure at a first pressure in horizontal direction of the folded laminated structure, then optionally annealing for a first time period at a first temperature, thereby obtaining the thermal interface material.

8. The method of claim 7, wherein the expression "processing the laminated structure based on modulus mismatch principle" refers to a processing technology in which the laminated structure is bonded to pre-stretched elastic body fixed by external force with Van der Waals force, then the external force is removed, and the laminated structure is folded.

9. The method of claim 7, which further comprises the following steps:
 c-1) providing a first slurry and a matrix which is the thermal interface material obtained in step b-3) or an intermediate part thereof, wherein the first slurry comprises a polymeric material and an optional thermal-conductivity reinforcing material; and
 c-2) filling or coating the matrix with the first slurry, and curing, thereby obtaining the thermal interface material.

10. An article, which comprises one or more components selected from the group consisting of:
 1) a thermal interface material of claim 1;
 2) an intermediate part of the thermal interface material (1); and
 3) a thermal interface material which comprises: (a) a matrix, which is a thermal interface material (1) or an intermediate part thereof; and (b) a filler, which is distributed on the surface and/or inside of the matrix.

* * * * *